United States Patent
Wu

(10) Patent No.: US 6,570,213 B1
(45) Date of Patent: May 27, 2003

(54) SELF-ALIGNED SPLIT-GATE FLASH MEMORY CELL AND ITS CONTACTLESS NOR-TYPE MEMORY ARRAY

(75) Inventor: Ching-Yuan Wu, Hsinchu (TW)

(73) Assignee: Silicon Based Technology Corp. (TW)

( * ) Notice: Subject to any disclaimer, the term of this patent is extended or adjusted under 35 U.S.C. 154(b) by 0 days.

(21) Appl. No.: 10/067,744

(22) Filed: Feb. 8, 2002

(51) Int. Cl.[7] .............................................. H01L 29/788
(52) U.S. Cl. ...................... 257/315; 257/314; 257/321; 438/257; 438/266
(58) Field of Search ................................ 257/239, 261, 257/298, 314–326; 438/201, 211, 216, 257, 261, 266, 268, 591, 593

(56) References Cited

U.S. PATENT DOCUMENTS

| | | | |
|---|---|---|---|
| 5,242,848 A | | 9/1993 | Yeh |
| 5,801,414 A | | 9/1998 | Shinmori |
| 5,989,960 A | | 11/1999 | Fukase |
| 6,103,573 A | | 8/2000 | Harari et al. |
| 6,133,097 A | * | 10/2000 | Hsieh et al. ............... 438/266 |
| 6,208,557 B1 | | 3/2001 | Bergemont et al. |
| 6,221,716 B1 | | 4/2001 | Lee et al. |
| 6,251,727 B1 | * | 6/2001 | Chen ......................... 438/257 |
| 6,380,583 B1 | * | 4/2002 | Hsieh et al. ............... 257/314 |
| 6,436,764 B1 | * | 8/2002 | Hsieh ......................... 438/257 |

OTHER PUBLICATIONS

Seiichi Aritome, Advanced Flash Memory Technology and Trends for File Storage Application.
Dry–Etching Various Types of Thin Films, 555–558.
Manufacturing Methods, 641–650.

* cited by examiner

*Primary Examiner*—David Nelms
*Assistant Examiner*—Long Tran

(57) ABSTRACT

A self-aligned split-gate flash memory cell and its contactless NOR-type memory array are disclosed by the present invention, which comprise a shallow-trench-isolation structure having an integrated floating-gate structure and the embedded double-sides erase cathodes; a self-aligned split-gate flash memory cell having a steep or one-side tapered floating-gate structure; a bit line integrated with planarized common-drain conductive islands; and a common-source conductive bus line. Therefore, the present invention offers a smaller cell area, a higher coupling ratio through an integrated floating-gate structure, a higher erasing speed through the embedded double-sides erase cathodes, higher contact integrity for shallow junction through a common-drain conductive island, and lower bus-line resistance and capacitance through a common-source conductive bus line.

20 Claims, 13 Drawing Sheets

US 6,570,213 B1

SELF-ALIGNED SPLIT-GATE FLASH MEMORY CELL AND ITS CONTACTLESS NOR-TYPE MEMORY ARRAY

BACKGROUND OF THE INVENTION

1. Field of the Invention

The present invention relates generally to a non-volatile semiconductor memory device and, more particularly, to a self-aligned split-gate flash memory cell and its contactless NOR-type memory array for high-density mass storage applications.

2. Description of Related Art

A non-volatile semiconductor memory device is known to store charges in a floating gate by means of either Fowler-Nordheim tunneling or hot-electron injection through a thin tunneling-oxide layer from a semiconductor substrate for programming operation and to remove or erase charges stored in a floating gate by means of Fowler-Nordheim tunneling through a thin tunneling-oxide layer to a semiconductor substrate or to a control gate for erasing operation. Based on the cell structure, the non-volatile semiconductor memory devices of the prior arts can be basically divided into two categories: a stack-gate structure and a split-gate structure.

A typical stack-gate structure of the prior arts is shown in FIG. 1A, where a thin tunneling-oxide layer 101 is formed over a semiconductor substrate 100; a doped polycrystalline-silicon layer 102 being acted as a floating gate is formed over a thin tunneling-oxide layer 101; an intergate dielectric layer 103 of preferably an oxide-nitride-oxide (ONO) structure is formed over the floating gate 102; a doped polycrystalline-silicon layer capped with a silicide layer is formed over an intergate dielectric layer 103 to act as a control gate 104; a source diffusion region is formed with a double-diffused structure having a shallow heavily-doped diffusion region 106a formed within a deeper moderately-doped diffusion region 105a; a shallow heavily-doped drain diffusion region 106b is formed in a semiconductor substrate 100; a sidewall dielectric spacer 107 is formed over the sidewalls of the stack-gate structure. The stack-gate length of a device can be patterned by using a minimum-feature-size of technology used and this device is recognized to be a one-transistor cell. However, the scaling of a stack-gate device shown in FIG. 1A becomes more difficult because a deeper double-diffused source structure is required to have a larger overlapping area between the floating gate and the double-diffused source structure for efficiently erasing stored electrons in a floating gate without producing the band-to-band tunneling effects. Moreover, the punch-through effect becomes a serious concern for programming using channel hot-electron injection as the stack-gate length becomes shorter.

A typical split-gate structure of the prior arts is shown in FIG. 1B, where a floating gate 112 is formed over a thin tunneling-oxide layer 111 and can be patterned by using a minimum-feature-size of technology used; a thicker oxide layer 113 is formed over a floating gate 112 and a semiconductor substrate 100; a control gate 114 is formed over a thicker oxide layer 113 and is then patterned by a critical masking step; the source and drain diffusion regions 115 and 116 are formed through a patterned control-gate 114 and a patterned floating gate 112 as a mask for self-aligned implantation. It is clearly seen that the gate-length of a device is much larger than a minimum-feature-size of technology used and is in general recognized to be a 1.5 transistor cell. Moreover, the alignment tolerance of the critical masking step for defining the control gate becomes a major issue as the split-gate structure is further scaled for high-density mass storage applications.

FIG. 1C shows another type of the split-gate structure, in which a stack-gate structure consisting of a thin tunneling-oxide layer 121, a floating gate 122, an intergate dielectric layer 123, and a control gate 124 can be patterned by using a minimum-feature-size of technology used; a polycrystalline-silicon spacer 125 is formed over one sidewall of the patterned stack-gate structure having a thicker oxide layer 126 formed on a semiconductor substrate 100 and is acted as a select gate; a heavily-doped source diffusion region 127a and a double-diffused drain structure consisting of a shallow heavily-doped drain diffusion region 127b within a deeper moderately-doped drain diffusion region 128 are formed. Basically, a non-critical masking step is required to remove a polycrystalline-silicon spacer formed over another sidewall of the patterned stack-gate structure and much better split-gate length controllability can be obtained as compared to a split-gate structure shown in FIG. 1B. However, the parasitic resistance of the select gate is high, because the select gate is formed by using only a doped polycrystalline-silicon spacer. As a consequence, the operation speed will be limited by a higher RC time constant of the select gate.

SUMMARY OF THE INVENTION

A self-aligned split-gate flash memory cell and its contactless NOR-type memory array for high-density mass storage applications are discolsed by the present invention. The floating-gate width of the present invention is formed by a shallow-trench-isolation (STI) structure having a higher coupling ratio and the embedded double-sides erase cathodes. The floating-gate length of the present invention is defined by a sidewall dielectric spacer formed over a sidewall in the common-source region and, therefore, can be controlled to be much smaller than a minimum-feature-size of technology used. A steep or one-side tapered floating-gate structure is formed and the sidewall of the steep or one-side tapered floating-gate is oxidized to form a field-emission cathode for efficiently erasing stored electrons in the floating-gate to the control gate. The control gate of the present invention is formed by a planarized conductive layer and the control-gate length is defined by another sidewall dielectric spacer formed over the same sidewall. Therefore, the control-gate length of the present invention can be controlled to be smaller than a minimum-feature-size of technology used. The afordmentioned self-aligned split-gate structure is used to implement a contactless NOR-type memory array, in which a plurality of word lines are formed in parallel with the control-gates in a row being connected to form a word line; a plurality of common-source conductive bus lines are sited over the flat beds formed alternately by the common-source diffusion regions and the etched raised field-oxide layers along the common-source lines; a plurality of common-drain conductive islands are formed over the common-drain diffusion regions; and a plurality of bit-lines are formed perpendicularly to the plurality of word lines and are integrated with the plurality of common-drain conductive islands. The common-source conductive bus lines and the common-drain conductive islands are formed by a highly conductive layer and are also acted as the dopant diffusion sources for forming very shallow heavily-doped source/drain diffusion regions. Therefore, the self-aligned split-gate flash memory cell of the present invention not only overcomes the major issues encountered by the split-gate structure of the prior arts but also can offer a smaller cell size for high-density mass storage applications as compared to the stack-gate structure of the prior arts.

BRIEF DESCRIPTION OF THE DRAWINGS

The features and advantages of the present invention will be more apparent from the following drawings in conjunction with the accompanying description, wherein:

FIG. 1A through FIG. 1C show the schematic diagrams of the prior arts, in which FIG. 1A shows a cross-sectional view of a stack-gate structure with a double-diffused source structure; FIG. 1B shows a cross-sectional view of a split-gate structure with a control gate; FIG. 1C shows a cross-sectional view of a split-gate structure with a control gate and a select gate;

FIG. 2A(b) shows a cross-sectional view of a self-aligned split-gate flash memory cell having a one-side tapered floating-gate structure; FIG. 2B shows a top plan view of a contactless NOR-type memory array of the present invention; FIG. 2C shows a cross-sectional view along a common-source conductive bus line B–B' in FIG. 2B; FIG. 2D shows a cross-sectional view along the floating-gate direction C–C' in FIG. 2B; FIG. 2E shows a cross-sectional view along a drain line D–D' in FIG. 2B;

DESCRIPTION OF THE PREFERRED EMBODIMENTS

Figure 1A:
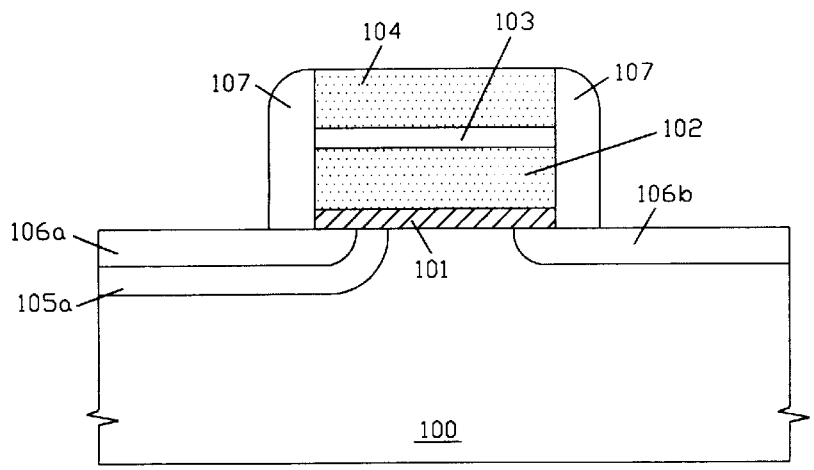
Figure 1B:
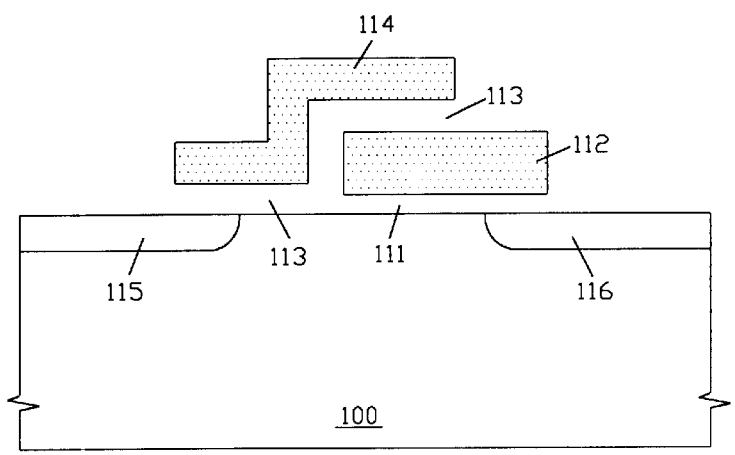
Figure 1C:
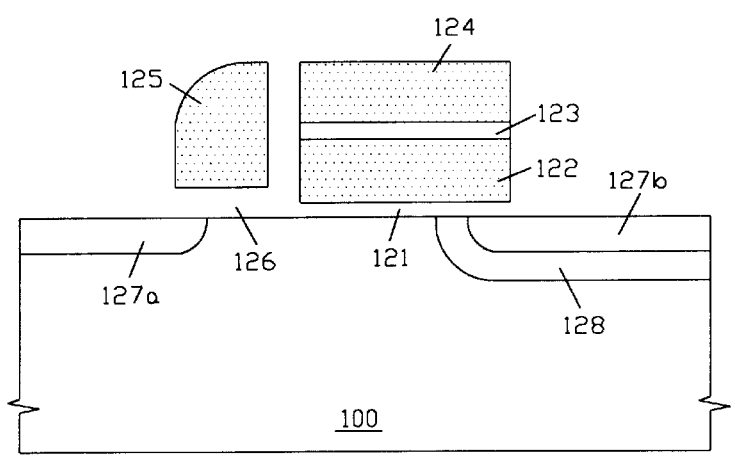
Figure 2A:
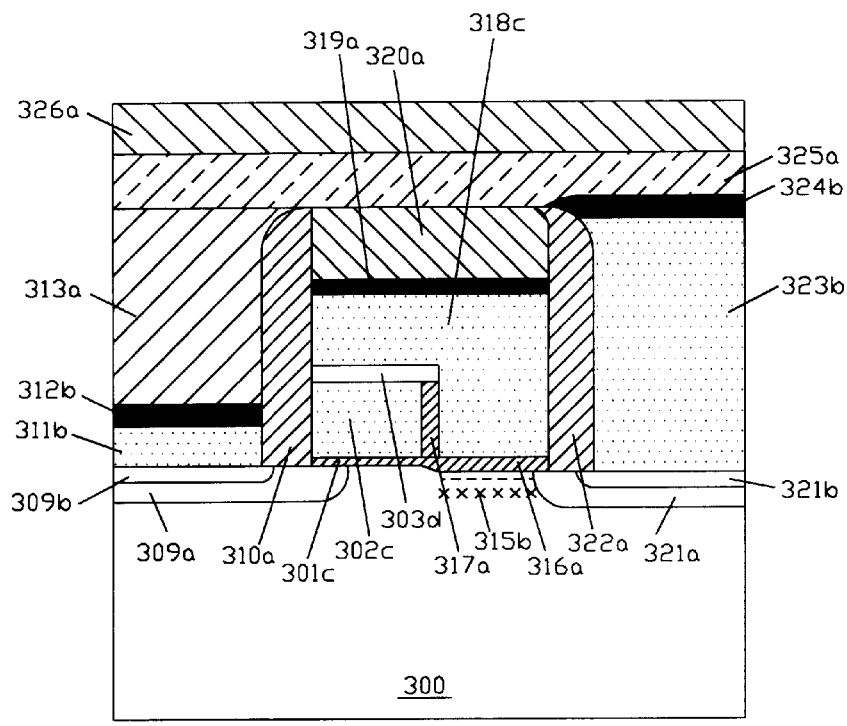
FIG. 2A through FIG. 2E show the schematic diagrams of a self-aligned split-gate flash memory cell and its contactless NOR-type memory array of the present invention, in which FIG. 2A(a) shows a cross-sectional view of a self-aligned split-gate flash memory cell having a steep floating-gate structure.
Figure 2A:
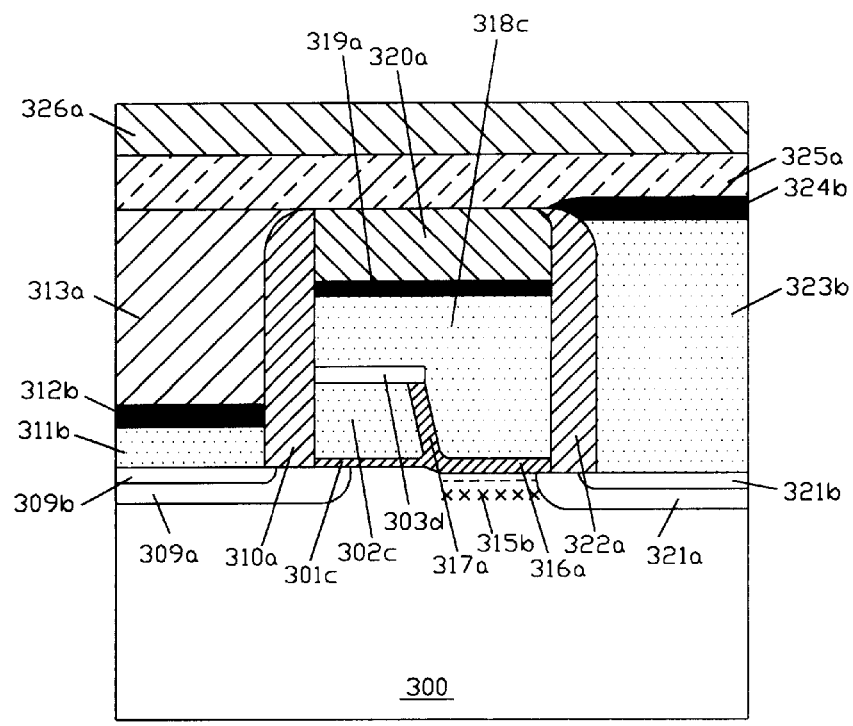

Referring now to FIG. 2A(a) and FIG. 2A(b), there are shown two cross-sectional views of self-aligned split-gate flash memory cells of the present invention. FIG. 2A(a) shows a cross-sectional view of a self-aligned split-gate flash memory cell having a steep floating-gate structure.

FIG. 2A(b) shows a cross-sectional view of a self-aligned split-gate flash memory cell having a one-side tapered floating-gate structure. Basically, FIG. 2A(a) and FIG. 2A(b) are fabricated by the same processes except the etching of the floating gate. The one-side tapered floating-gate structure shown in FIG. 2A(b) is formed by a taper etching and can offer a larger sidewall area for erasing the stored electrons in the floating gate to the control-gate.

As shown in FIG. 2A(a) and FIG. 2A(b), a self-aligned split-gate structure is formed within three sidewall dielectric spacers 310a, 322a, and 320a, in which a steep or one-side tapered floating-gate 302c is sited on a thin tunneling-dielectric layer 301c and is capped on top with an intergate dielectric layer 303d and has a first poly-oxide layer 317a formed over a sidewall of the steep or one-side tapered floating-gate 302c; an elongated control-gate layer is formed by a planarized fourth conductive layer 318c capped with a second metal-silicide layer 319a and is sited on an intergate dielectric layer 303d, a first thermal poly-oxide layer 317a, and a gate-dielectric layer 316a. The self-aligned split-gate structure shown in FIG. 2A(a) and FIG. 2A(b) can be divided into two regions: a floating-gate region and a select-gate region, in which the floating-gate region comprises a floating-gate transistor with the steep or one-side tapered floating-gate layer 302c being formed on the thin tunneling-dielectric layer 301c and the select-gate region comprises a select-gate transistor with a portion of the elongated control-gate layer 318c being formed on the gate-dielectric layer 316a. It should be noted that the steep or one-side tapered floating-gate layer 302c forms a field-emission cathode to erase stored electrons from the steep or one-side tapered floating-gate 302c to the planarized fourth conductive layer 318c through a first thermal poly-oxide layer 317a. A deeper source diffusion region 309a of a second conductivity-type and a deeper drain diffusion region 321a of a second conductivity type are formed independently in a semiconductor substrate 300 of a first conductivity type and can be heavily-doped, moderately-doped or lightly doped, depending on device operation requirements. A shallow heavily-doped source diffusion region 309b of a second conductivity-type and a shallow heavily-doped drain diffusion region 321b of a second conductivity type are separately formed by using the planarized third and fifth conductive layers 311b and 323b being acted as the dopant diffusion sources. It should be noted that the planarized fifth conductive island 323b capped with a third metal-silicide layer 324b being located between the fifth sidewall dielectric spacers 322a forms a common-drain conductive island and a planarzied third conductive layer 311b capped with a first metal-silicide layer 312b being located between the second sidewall dielectric spacers 310a forms a common-source conductive bus line, as will be shown in FIG. 2C and FIG. 2E. Since the floating-gate length and the control-gate length are separately defined by a sidewall dielectric spacer, the control-gate length can be made to be smaller than a minimum-feature-size (F) of technology used.

Figure 2B:
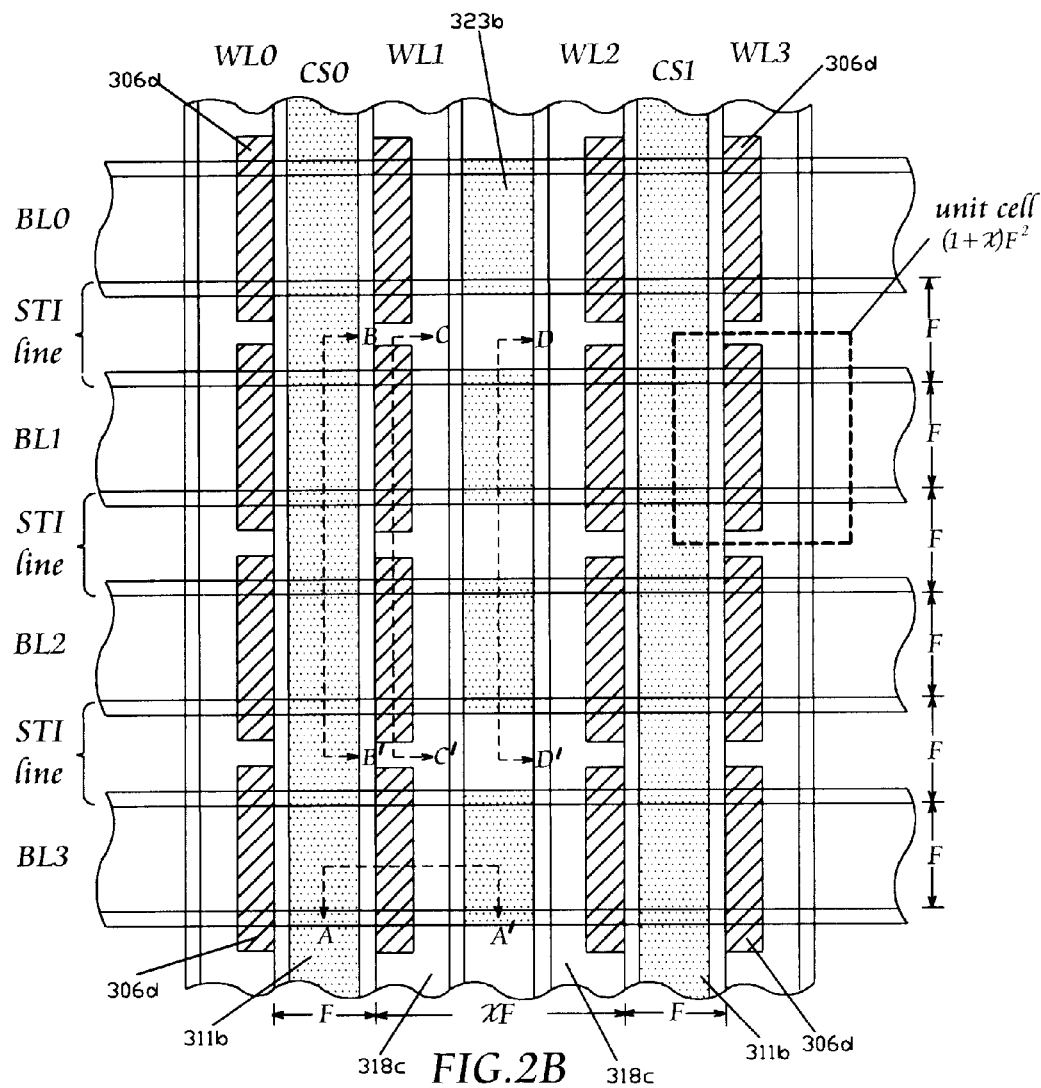
Figure 2C:
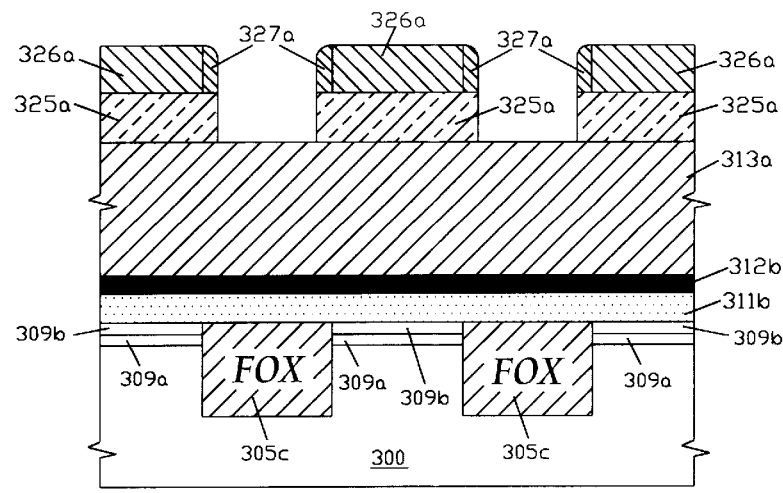
Figure 2D:
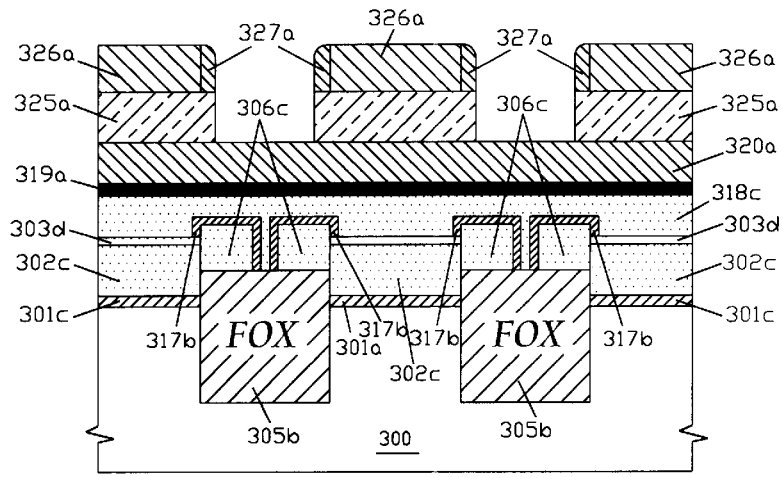
Figure 2E:
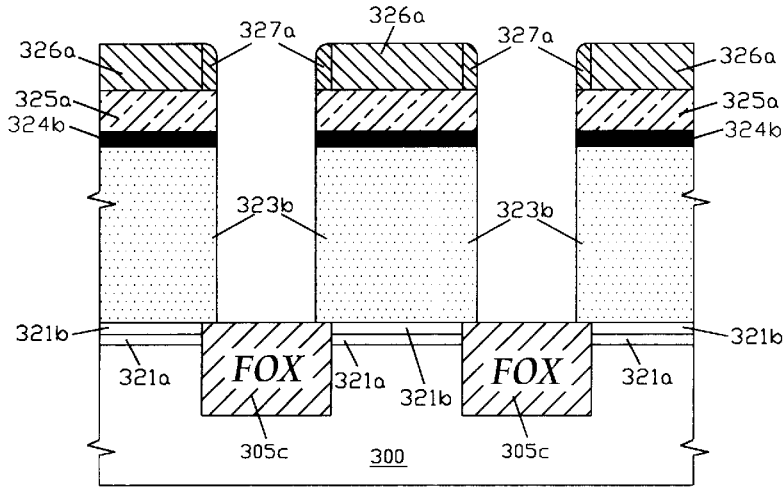

Referring now to FIG. 2B through FIG. 2E, there are shown the schematic diagrams of a contactless NOR-type memory array of the present invention, in which FIG. 2B shows a top plan view of a contactless NOR-type memory array; FIG. 2C shows a cross-sectional view along a common-source conductive bus line (B–B'); FIG. 2D shows a cross-sectional view of the integrated floating-gate structure along the word line (C–C'); FIG. 2E shows a cross-sectional view along a drain line (D–D'). FIG. 2B shows a top plan view of a contactless NOR-type memory array using a self-aligned split-gate flash memory cell shown in FIG. 2A(a) or FIG. 2A(b) as a memory cell, in which a cross-sectional view of a cell in the channel-length direction as marked by A–A' is shown in FIG. 2A(a) and FIG. 2A(b). As shown in FIG. 2B, a plurality of word lines (WL0~WL3) using the elongated control-gate layer 318c are formed alternately in parallel; a plurality of common-source conductive bus lines 311b are formed between the neighboring word lines (for example: the word line WL0 and the word line WL1 and between the word line WL2 and the word line WL3); a plurality of planarized common-drain conductive islands 323b are formed between another neighboring word lines (for example: the word line WL1 and the word line WL2) and between the shallow-trench-isolation regions (STI line) perpendicular to the word lines. The planarized common-drain conductive islands 323b in a column are integrated with a bit line (BL) and the plurality of bit lines (BL0~BL3) are formed in parallel and are perpendicular to the plurality of word lines. Each of the integrated floating-gate layers 306d including a major floating-gate layer 302a being formed over a thin tunneling-dielectric layer 301c and two extended floating-gate layers 306c being formed on a portion of nearby raised field-oxide layers 305b is formed under the word line. There are four embedded field-emission cathode lines being formed by a step shape of the extended floating-gate layer 306c for each unit cell of the present invention. A unit cell as marked by the dash square can be controlled to be smaller than $4F^2(2F\times 2F)$ through adjusting the control-gate length and the floating-gate length using the sidewall dielectric spacers.

FIG. 2C shows a cross-sectional view along a common-source conductive bus line 311b as indicated by B–B' shown in FIG. 2B, in which the extended floating-gate layers 306c and the raised field-oxide layers 305b (FOX) higher than the semiconductor surface of the shallow heavily-doped source diffusion regions 309b along the common-source bus line are anisotropically etched to form a first flat bed for a common-source conductive bus line 311b. The common-source conductive bus line 311b is formed by using a heavily-doped polycrystalline-silicon layer 311b being capped with a first metal-silicide layer 312b. The planarized thick-oxide layer 313a is formed over the first metal-silicide layer 312b and a plurality of bit lines (BL) consisting of a first interconnect-metal layer 325a over a barrier-metal layer (not shown) are formed over the planarized thick-oxide layer 313a. Each of the plurality of bit lines is patterned by a hard masking layer being formed by a third masking dielectric layer 326a and its two sixth sidewall dielectric spacers 327a.

FIG. 2D shows a cross-sectional view of the floating-gate along a word line as indicated by C–C' shown in FIG. 2B, in which two extended second conductive layers 306c are connected with a major floating-gate 302c to form an integrated floating-gate layer 306d (see FIG. 2B) in order to increase the coupling ratio of a floating gate and are also acted as the embedded double-sides erase cathodes. A second thermal poly-oxide layer 317b formed over the extended second conductive layers 306c is acted as a tunneling dielectric layer. The elongated control-gate consisting of a planarized fourth conductive layer 318c capped with a second metal-silicide layer 319a is formed over the second thermal poly-oxide layers 317b, the intergate dielectric layers 303d, and the raised field-oxide layers 305b (FOX). The fourth sidewall dielectric spacer 320a used to define the control-gate length is formed over the elongated control-gate. A plurality of bit lines consisting of the first interconnect-metal layer 325a over a first barrier-metal layer are formed over the fourth sidewall dielectric spacers 320a. Similarly, each of the plurality of bit lines is patterned and etched by a hard third masking layer being formed by a third masking dielectric layer 326a and its two sixth sidewall dielectric spacers 327a.

FIG. 2E shows a cross-sectional view along a drain line (DL) as indicated by D–D' shown in FIG. 2B, in which the common-drain conductive island 323b made of a heavily-doped polycrystalline-silicon island capped with a third metal-silicide layer 324b is located between the fifth sidewall dielectric spacers 322a and are sited on a shallow heavily-doped drain diffusion region 321b formed within a deeper lightly-doped drain diffusion region 321a and a portion of nearby etched raised field-oxide layers 305c. The common-drain conductive islands 323b in a column are integrated with a bit line (BL) formed by the first interconnect-metal line 325a over a second barrier-metal layer and are patterned and etched by a hard masking layer being formed by a third masking dielectric layer 326a and its two sixth sidewall dielectric spacers 327a. It is clearly seen that the sixth sidewall dielectric spacer 327a is mainly used to eliminate the misalignment between an active region and a bit line.

Apparently, the features and advantages of the present invention can be summarized as follows:

(a) A shallow-trench-isolation structure with an integrated floating-gate layer having a larger floating-gate area and the embedded double-sides erase cathodes is formed on a semiconductor substrate to increase the coupling ratio of the floating gate and the erasing speed of a self-aligned split-gate flash memory device of the present invention;

(b) The floating-gate length is defined by a sidewall dielectric spacer and can be made to be smaller than a minimum-feature-size of technology used and the control-gate length is also defined by another sidewall dielectric spacer formed in a self-aligned manner on the same sidewall. Therefore, the cell size of a self-aligned split-gate structure of the present invention can be made to be smaller than that of a stack-gate structure used by the prior art;

(c) A steep or one-side tapered floating-gate structure of the present invention offers a field-emission cathode along the cell-width direction to further increase the erasing speed of a self-aligned split-gate flash memory cell of the present invention;

(d) The common-source conductive bus line of the present invention being sited on a flat bed is acted as a dopant diffusion source for forming shallow heavily-doped common-source diffusion regions and is formed by a highly conductive layer capped with a silicide layer. Therefore, the common-source conductive bus line of the present invention offers lower common-bus line resistance and lower common-bus line capacitance with respect to a semiconductor substrate. Moreover, the junction leakage current due to the common-bus line can be minimized by the present invention as compared to the buried common-bus line of the prior art;

(e) The planarized common-drain conductive island of the present invention is formed by a highly conductive layer capped with a silicide layer, which not only offers a higher degree of contact integrity for shallow junction but also provides a dopant diffusion source for forming a shallow drain diffusion region; and (f) The bit line and the planarized common-drain conductive islands of the present invention are patterned and etched by a hard masking layer being formed by a masking dielectric layer and its two sidewall dielectric spacers to form a contactless NOR-type memory array of the present invention.

Figure 3A:
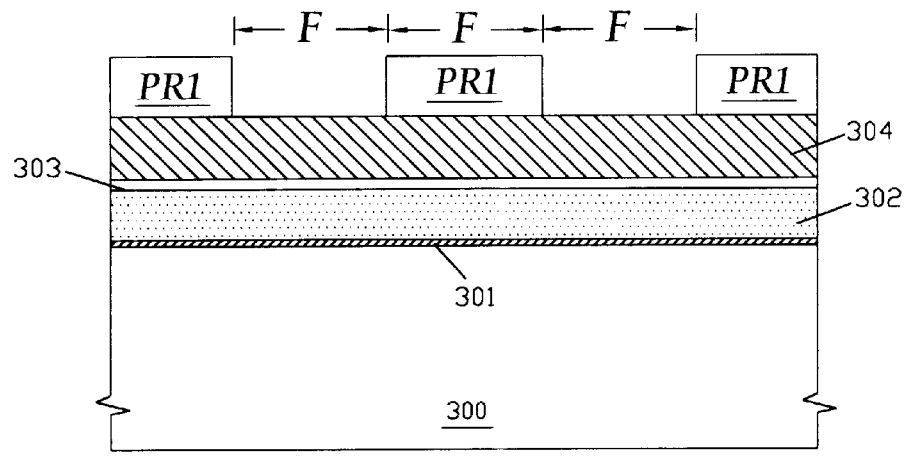
FIG. 3A through FIG. 3I show the process steps and their cross-sectional views in the channel-width direction for fabricating a shallow-trench-isolation structure having an integrated floating-gate structure and the embedded double-sides erase cathodes of the present invention.
Figure 3B:
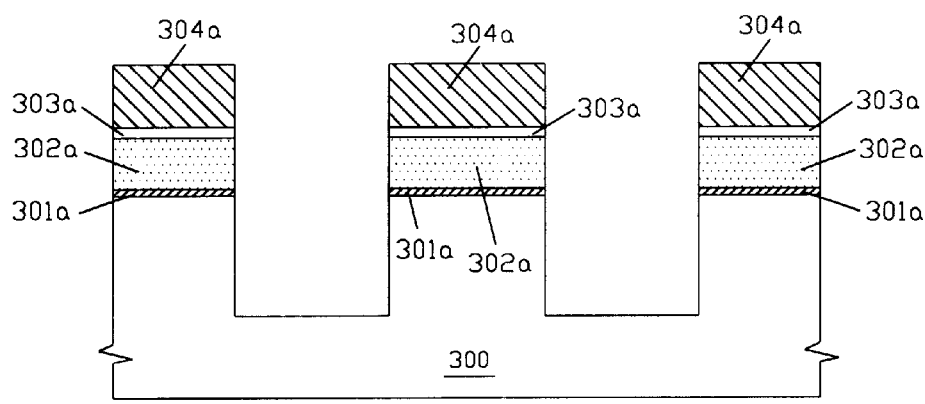
Figure 3C:
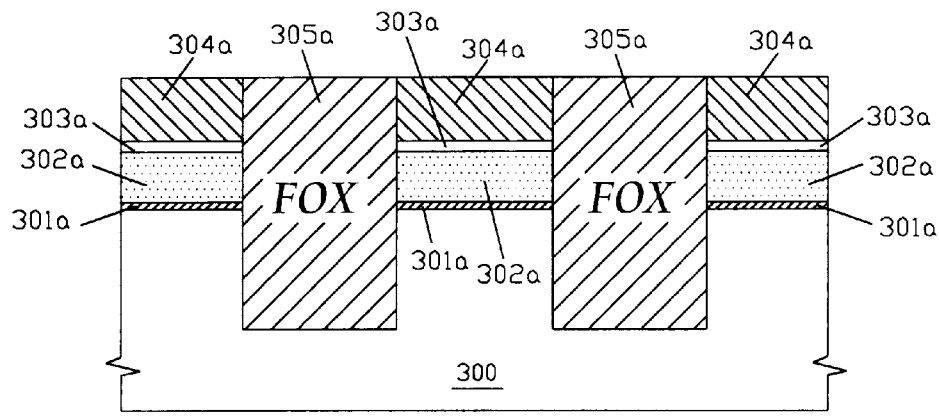
Figure 3D:
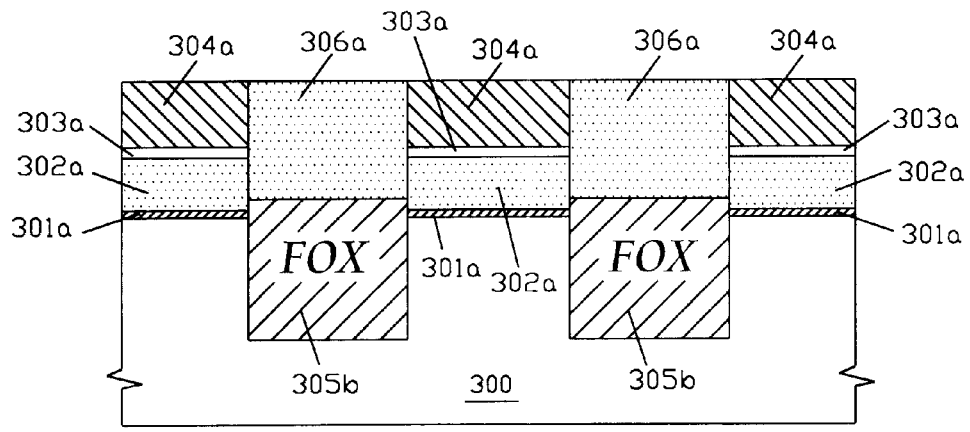
Figure 3E:
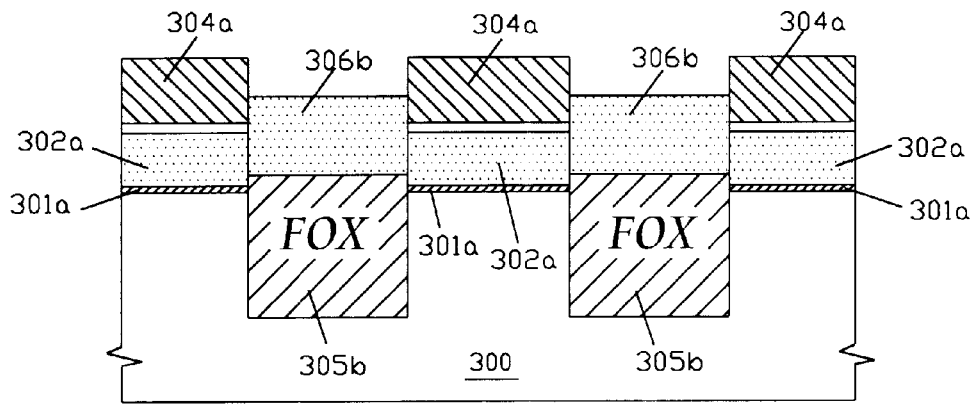
Figure 3F:
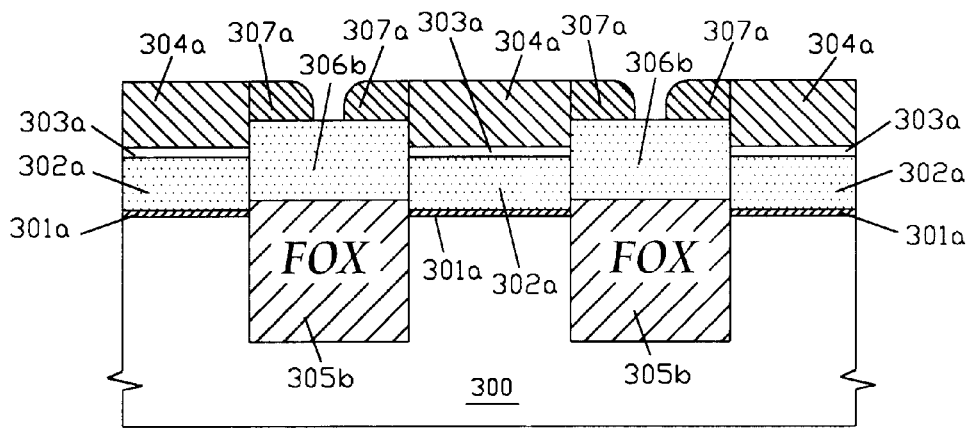
Figure 3G:
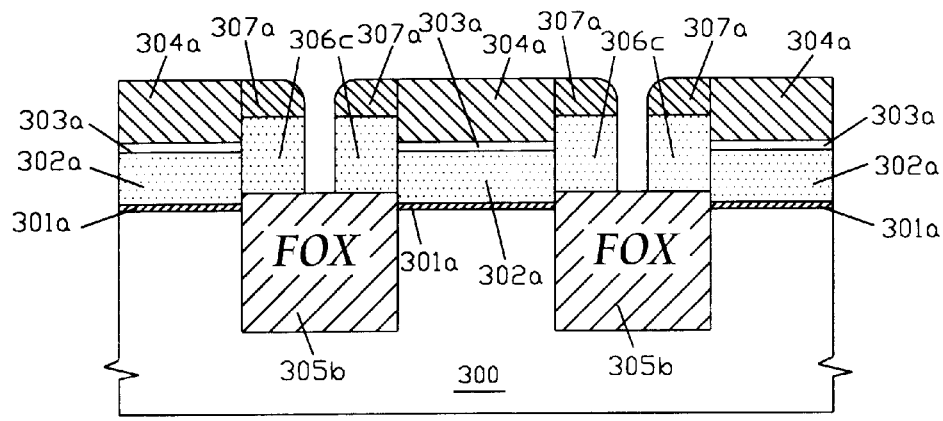
Figure 3H:
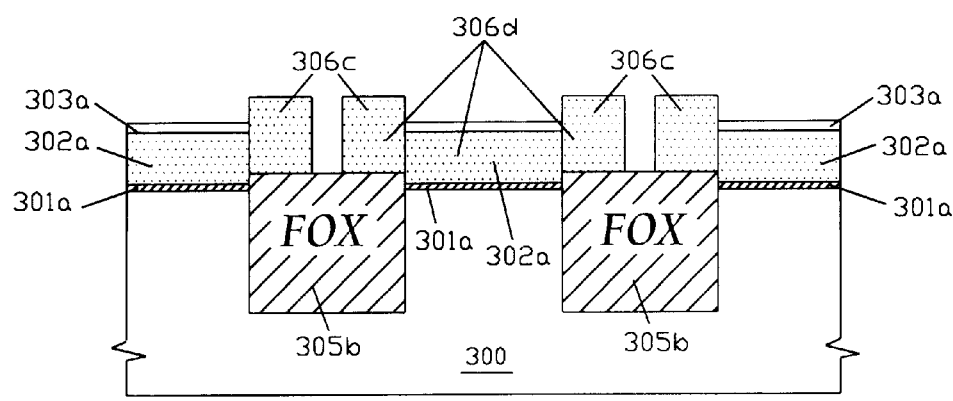
Figure 3I:
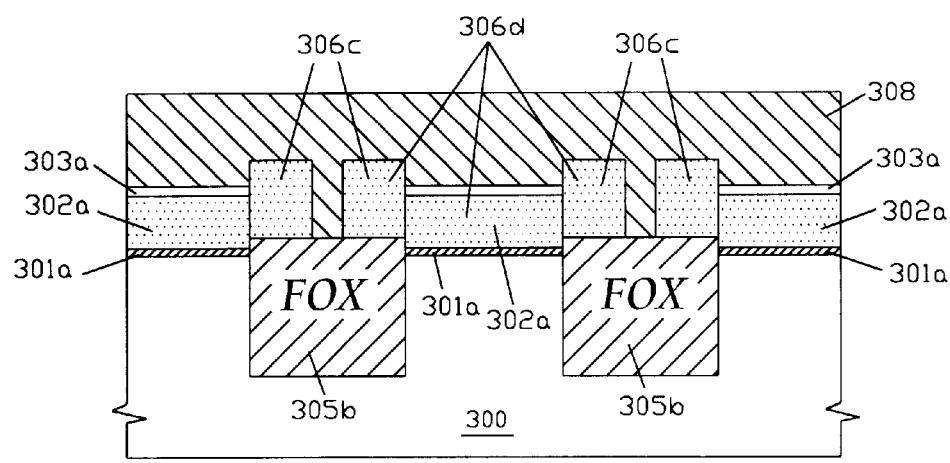
Figure 4A:
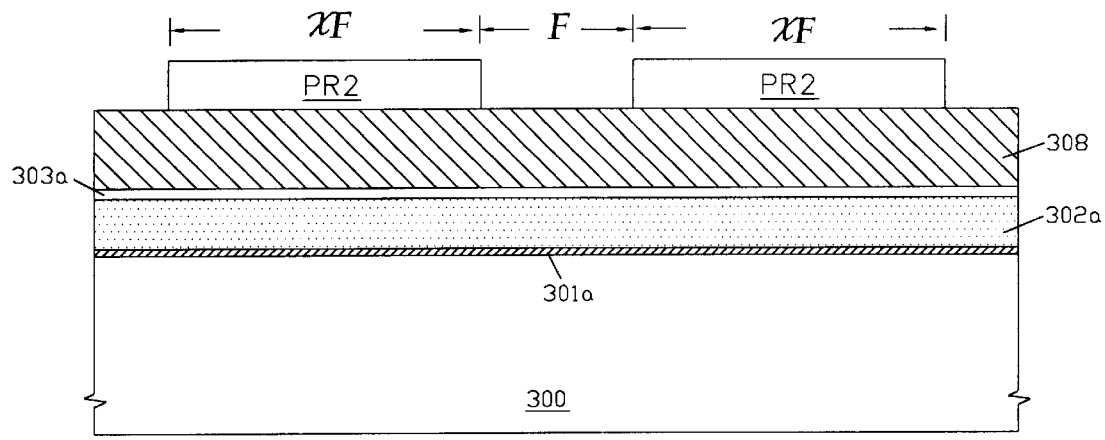
FIG. 4A through FIG. 4Q show the process steps and their cross-sectional views in the channel-length direction (A–A') for fabricating a self-aligned split-gate flash memory cell and its contactless NOR-type memory array of the present invention.
Figure 4B:
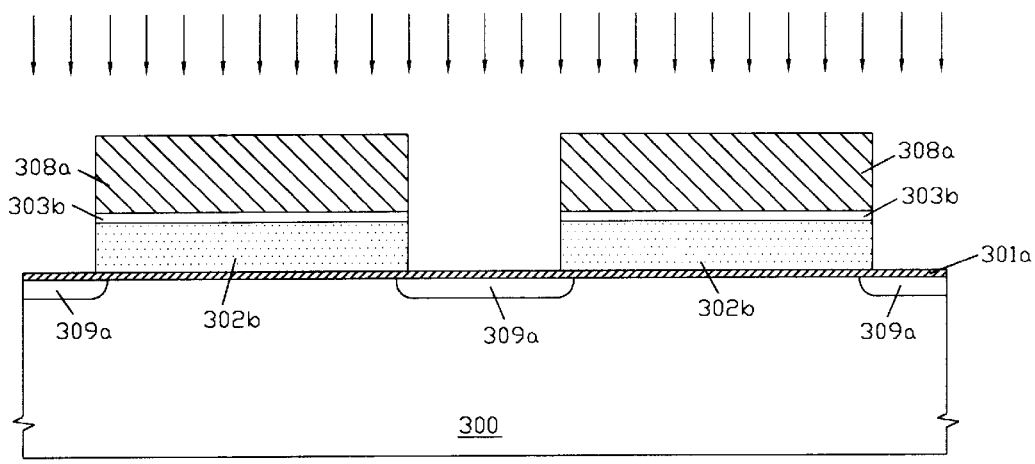
Figure 4C:
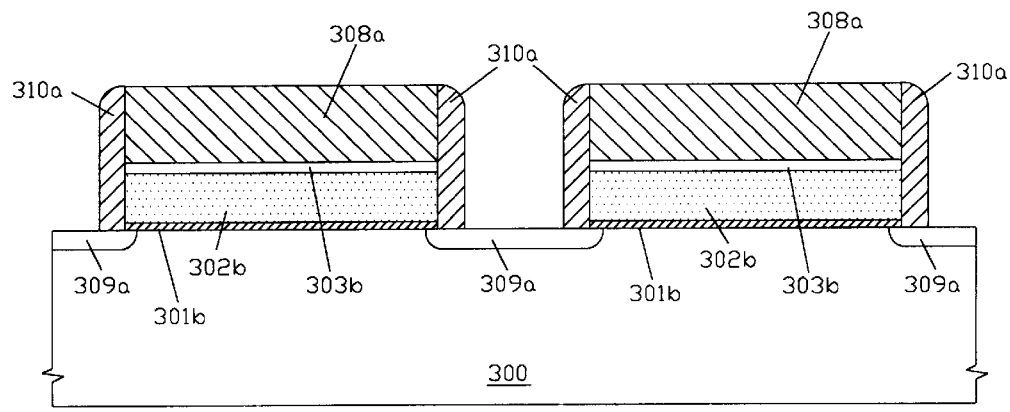
Figure 4D:
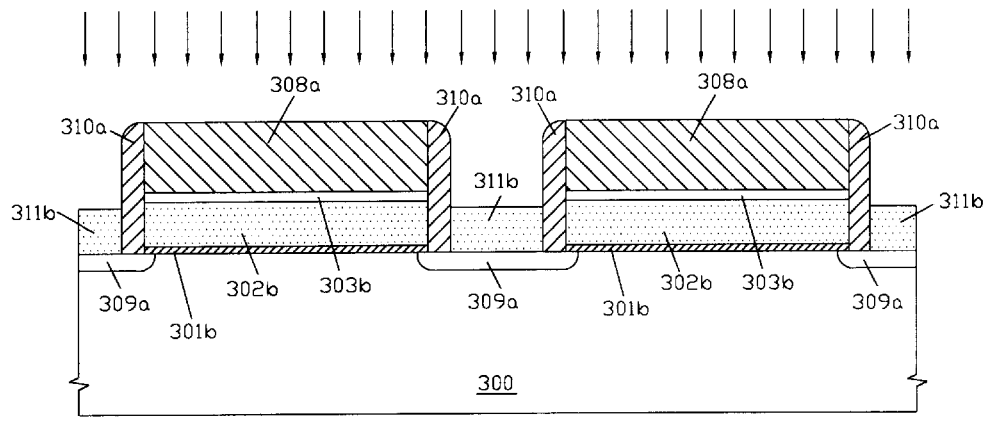
Figure 4E:
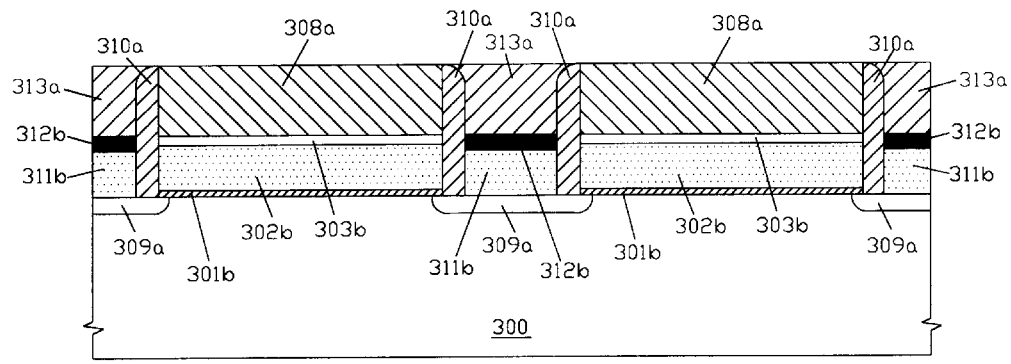
Figure 4F:
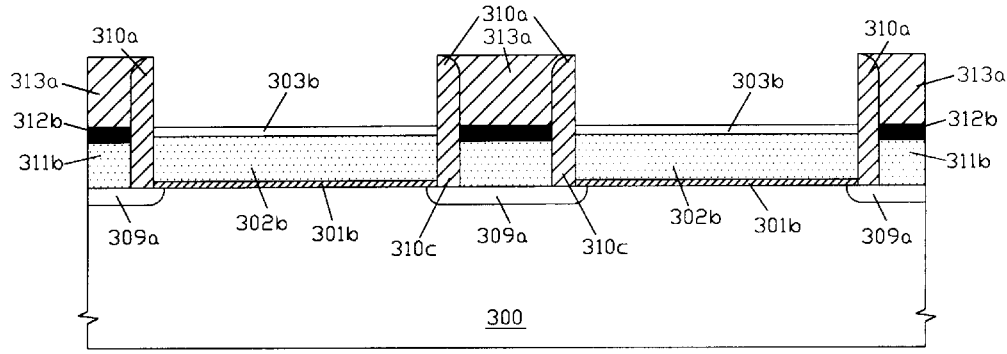
Figure 4G:
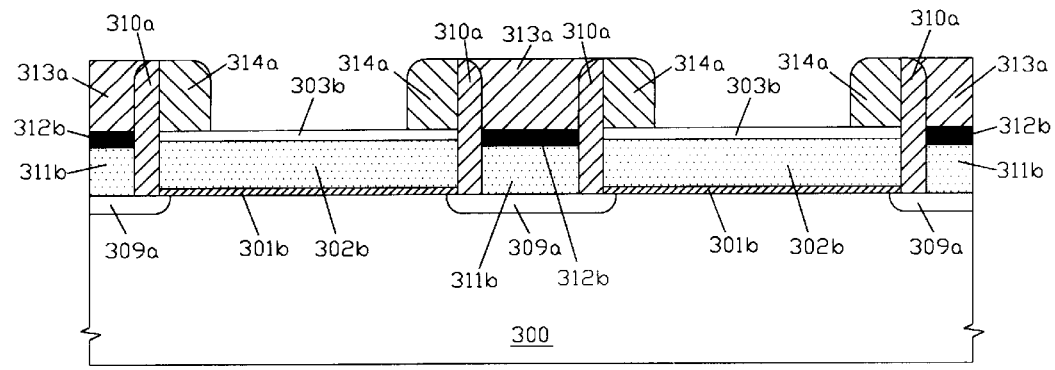
Figure 4H:
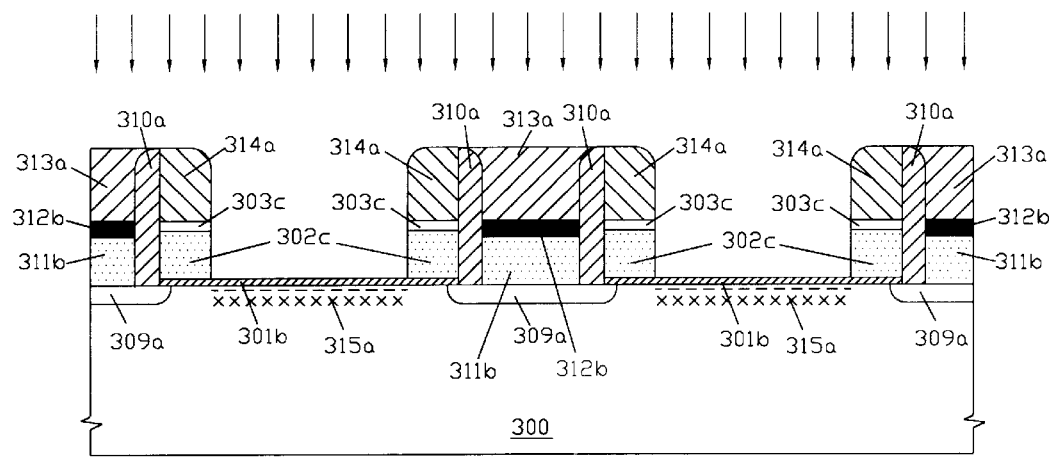
Figure 4I:
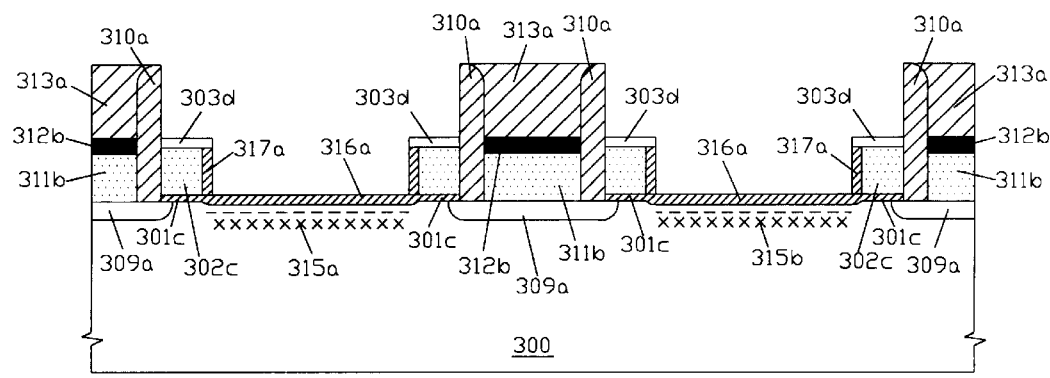
Figure 4J:
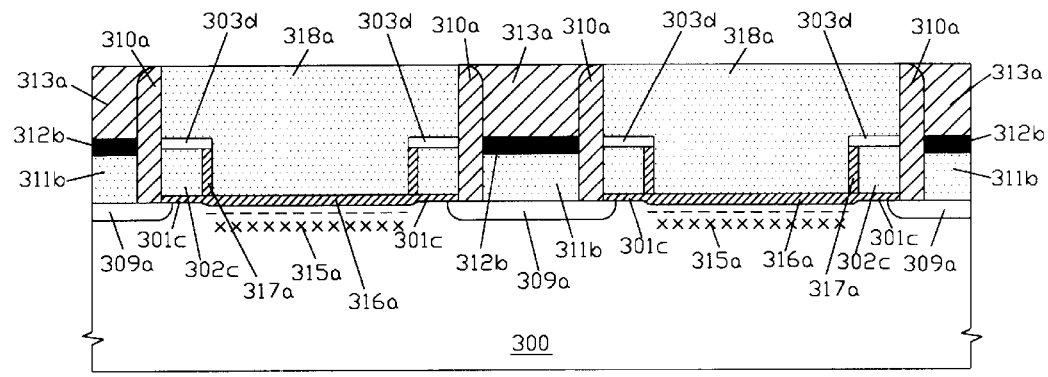
Figure 4K:
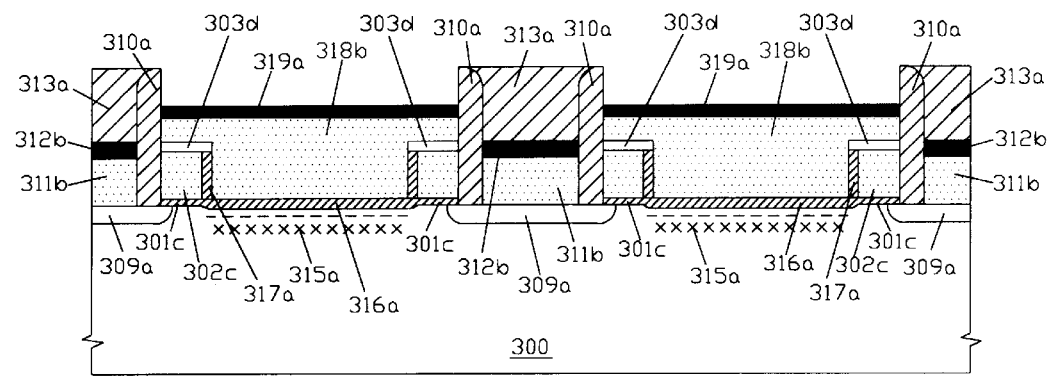
Figure 4L:
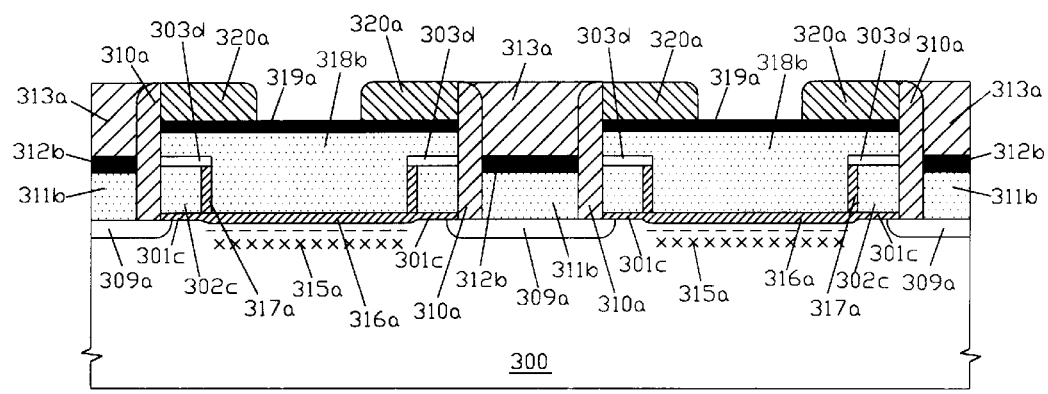
Figure 4M:
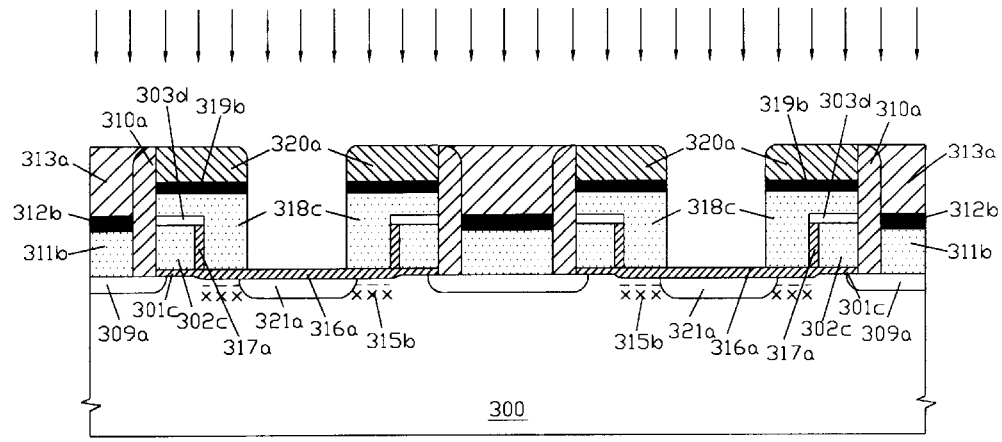
Figure 4N:
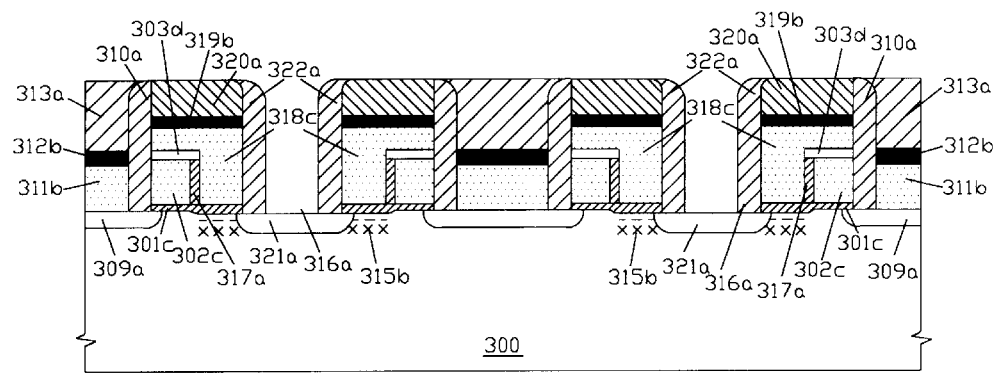
Figure 4O:
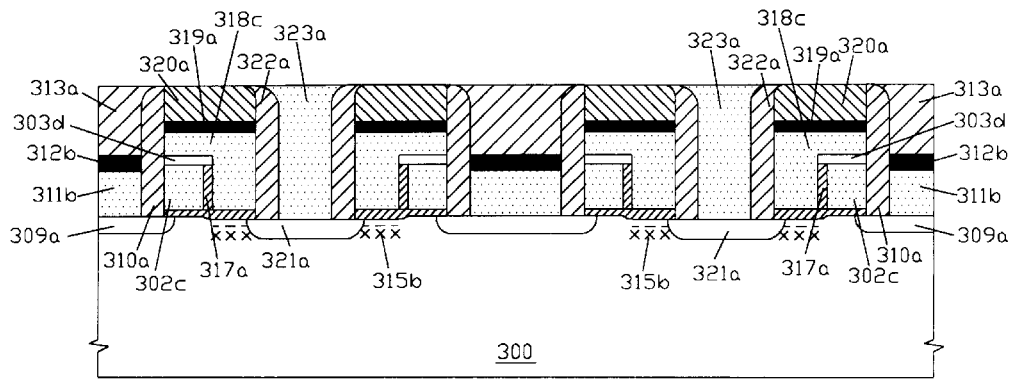
Figure 4P:
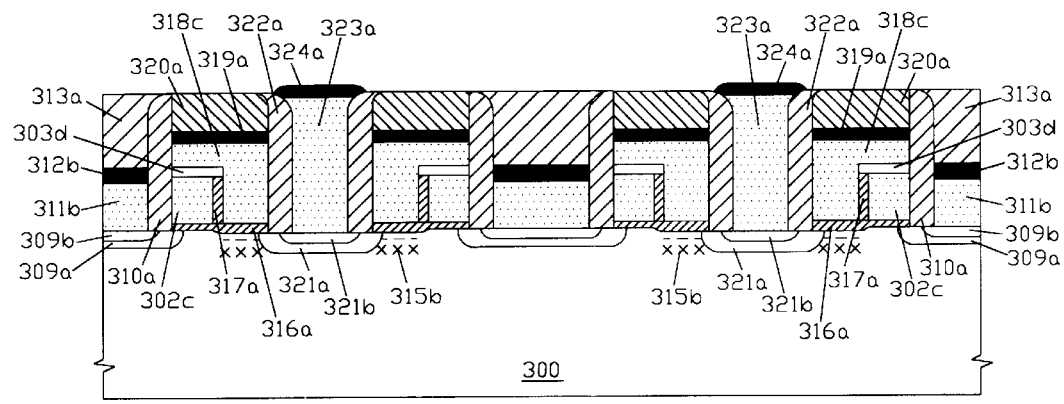
Figure 4Q:
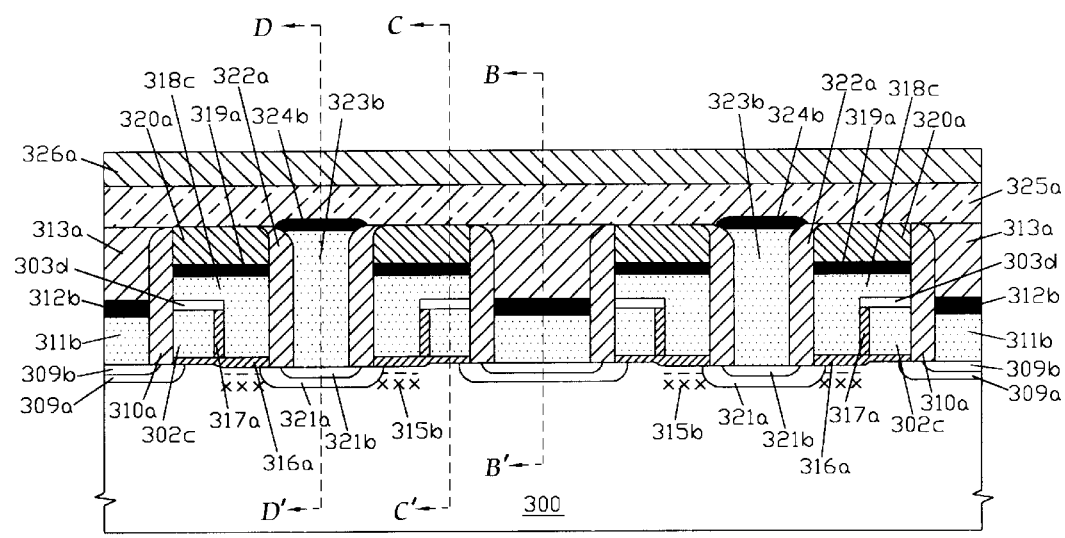

The detailed process steps and their cross-sectional views for fabricating the embodiments of the present invention are shown in FIG. 3A through FIG. 3I and FIG. 4A through FIG. 4Q, in which FIG. 3A through FIG. 3I show the process steps and their cross-sectional views of a shallow-trench-isolation structure in the channel-width direction; FIG. 4A through FIG. 4Q show the process steps and their cross-sectional views for fabricating a self-aligned split-gate flash memory cell and its contactless NOR-type memory array in the channel-length direction.

FIG. 3A shows a thin tunneling-dielectric layer 301 is formed on a semiconductor substrate 300 of a first conductivity type, a first conductive layer 302 is formed over a thin tunneling-dielectric layer 301, an intergate dielectric layer 303 is formed over a first conductive layer 302, a first masking dielectric layer 304 is formed over the intergate dielectric layer 303, and a plurality of patterned masking photoresist PR1 are formed over the first masking dielectric layer 304 to define a plurality of parallel shallow-trench-isolation (STI) regions. The thin tunneling-dielectric layer 301 can be a thermal-oxide layer or a nitrided thermal-oxide layer and its thickness is between about 60 Angstroms and 150 Angstroms. The first conductive layer 302 can be a doped polycrystalline-silicon layer or a doped amorphous-silicon layer preferably deposited by low-pressure chemical-vapor-deposition (LPCVD) and its thickness is between about 500 Angstroms to 2000 Angstroms. The intergate dielectric layer 303 can be a thermal poly-oxide layer or a nitrided thermal poly-oxide layer or a composite dielectric layer of preferably an oxide-nitride-oxide (ONO) structure having an equivalent oxide thickness of between about 70 Angstroms and 150 Angstroms. The first masking dielectric layer 304 is preferably a silicon-nitride layer deposited by LPCVD and its thickness is between about 1000 Angstroms and 5000 Angstroms.

FIG. 3B shows that the patterned structure in FIG. 3A is anisotropically etched to selectively remove a first masking dielectric layer 304, an intergate dielectric layer 303, a first conductive layer 302, and a thin tunneling-dielectric layer 301 in sequence. The semiconductor substrate 300 is then anisotropically etched to form a plurality of shallow trenches and the patterned masking photoresist PR1 are then stripped. The depth of shallow trenches is between about 3000 Angstroms and 7000 Angstroms.

FIG. 3C shows that the shallow trenches are filled with the planarized field-oxide layers (FOX) 305a. The planarized field-oxide layer 305a is formed by first depositing a thick field-oxide layer 305 and then planarizing the deposited thick field-oxide layer 305 preferably by chemical-mechanical polishing (CMP) with the first masking dielectric layer 304a as a polishing stop. The thick field-oxide layer 305 is preferably made of silicon-oxides or phosphosilicate glass (PSG) and is deposited preferably by high-density plasma CVD (HDPCVD) or chemical-vapor-deposition (CVD).

FIG. 3D shows that the planarized field-oxide layers (FOX) 305a are anisotropically etched back to a level approximately 200 Angstroms to 500 Angstroms above the surface of the semiconductor substrate 300 and then a planarized second conductive layer 306a is formed to fill up the etched-back gaps. The planarized second conductive layer 306a is preferably made of doped polycrystalline-silicon or doped amorphous-silicon, as deposited by LPCVD.

FIG. 3E shows that the planarized second conductive layers 306a are selectively etched back to a level slightly higher than the top surface of the intergate dielectric layer 303a to form the etched-back planarized second conductive layers 306b.

FIG. 3F shows that the first sidewall dielectric spacers 307a are formed over the sidewalls of the etched-back gaps and on the etched-back planarized second conductive layers 306b to define the extended length of the etched-back planarized second conductive layer.

FIG. 3G shows that the etched-back planarized second conductive layer 306b is selectively removed by using the first masking dielectric layers 304a and the first sidewall dielectric spacers 307a as the etching hard mask to form the extended second conductive layers 306c. It should be noted that the planarized second conductive layers 306a are etched back to a level higher than a top surface of an intergate dielectric layer 303a to form a step-type extended second conductive layers 306c. Two sharp corners for each extended second conductive layer 306c are used as the field-emission cathodes to enhance the erasing speed.

FIG. 3H shows that the first masking dielectric layers 304a and the first sidewall dielectric spacers 307a are selectively removed by using either a wet-chemical solution of hot-phosphoric acid or anisotropic dry etching. Note that ion-implantation can be performed to heavily dope the first conductive layers 302a and the extended second conductive layers 306c if needed. A first conductive layer 302a and two extended second conductive layers 306c form an integrated floating-gate layer 306d. From FIG. 3H, it is clearly seen that the coupling ratio of the integrated floating-gate layer 306d is much increased by the extended second conductive layers 306c and the embedded double-sides erase cathodes are formed without extra masking photoresist step.

FIG. 3I shows that a second masking dielectric layer 308 is conformably deposited over the formed structure shown in FIG. 3H. The second masking dielectric layer 308 is preferably made of silicon-nitrides deposited by LPCVD and its thickness is preferably between 3000 Angstroms and 8000 Angstroms.

It should be noted that the process of forming the planarized second conductive layers 306a shown in FIG. 3D can be replaced by a process of forming second conductive spacers over the sidewalls formed by the etched-back planarized field-oxide layers 305b to form an extended ridge-type floating-gate structure, and the process steps shown in FIG. 3D through FIG. 3G are not required.

According to FIG. 3I, a cross-sectional view along the center of the active region is shown in FIG. 4A, in which a plurality of patterned masking photoresist PR2 are formed to define the virtual gate region XF (under PR2) and the common-source region F (between PR2) of a NOR-type memory array. FIG. 4B shows that the common-source regions are anisotropically etched to selectively remove the second masking dielectric layer 308, the intergate dielectric layer 303a, and the extended second conductive layers 306c a part of the first conductive layers 302a; the raised field-oxide layers 305b are etched back to a level equal to the top level of the thin tunneling-dielectric layer 301a and then the remained first conductive layers 301a are removed. Subsequently, the common-source diffusion regions 309a of a second conductivity type are then formed by implanting a moderate dose of doping impurities across a thin tunneling-dielectric layer 301a into the active regions of a semiconductor substrate 300, as shown in FIG. 4B.

FIG. 4C shows that a thin tunneling-dielectric layer 301a over the common-source diffusion regions 309a is selectively removed by dipping in dilute hydrofluoric acid and the etched raised field-oxide layers 305c are slightly etched to form a first flat bed, and a second sidewall dielectric spacer 310a is then formed over the sidewalls of the formed structure. The second sidewall dielectric spacer 310a is preferably made of silicon-oxides as deposited by LPCVD with a spacer width preferably between about 150 Angstroms and 1000 Angstroms.

FIG. 4D shows that the planarized third conductive layers 311a are then formed over the first flat bed between the second sidewall dielectric spacers 310a and are then etched back to a level approximately equal to a top level of the intergate dielectric layer 303b to form the etched-back planarized third conductive layers 311b. An ion-implantation is then performed to implant a high-dose of doping impurities into the etched-back planarized third conductive layers 311b to form the dopant diffusion sources of a second conductivity type. The planarized third conductive layer 311a is formed by first depositing a thick third conductive layer 311 over the formed structure and then planarizing the deposited thick third conductive layer 311 using chemical-mechanical polishing (CMP) with the second masking dielectric layer 308a as a polishing stop. The planarized third conductive layer 311a is preferably a doped polycrystalline-silicon or doped amorphous-silicon layer as deposited by LPCVD.

FIG. 4E shows that a first metal-silicide layer 312b is formed over the etched-back planarized third conductive layers 311b and then the planarized thick-oxide layers 313a are formed to fill up the gaps between the second sidewall dielectric spacers 310a. The first metal-silicide layer 312b is preferably formed by using the well-known self-aligned silicidation process or by using the method of forming the etched-back planarized third conductive layers 311b. The first metal-silicide layer 312b is preferably made of tungsten-silicides or other high melting-point silicides. The planarized thick-oxide layer 313a is formed by first depositing a thick-oxide layer 313 over the structure and then planarizing the deposited thick-oxide layer 313 using CMP with the second masking dielectric layer 308a as a polishing stop. The planarized thick-oxide layer 313a is preferably made of silicon-oxides deposited by high-density plasma CVD or CVD.

FIG. 4F shows that the second masking dielectric layer 308a is selectively removed by using a wet-chemical solution of hot-phosphoric acid or anisotropic dry etching.

FIG. 4G shows that third sidewall dielectric spacers 314a are formed over the formed sidewalls to define the gate length of the floating gate. The third sidewall dielectric spacer 314a is preferably made of silicon-nitrides as deposited by LPCVD.

FIG. 4H shows that the intergate dielectric layer 303b is first selectively etched in a self-aligned manner, and the extended second conductive layer 306c and the first conductive layer 302b are etched to form a steep floating-gate structure by anisotropic dry etching, and subsequently, an ion-implantation can be performed by implanting doping impurities across a thin tunneling-dielectric layer 301b into a semiconductor substrate 300 to form an implanted region 315a with a shallow implant region (as marked by the dash line) for threshold-voltage adjustment and a deeper implant region (as marked by the cross symbols) for forming a punch-through stop. Note that the one-side tapered floating-gate structure can be performed by using a taper etching and the taper angle can be controlled to be between about 45 degree and 90 degree, as shown in FIG. 2A(b).

FIG. 4I shows that the thin tunneling-dielectric layers 301b and the raised field-oxide layers 305b outside of the third sidewall dielectric spacers 314a are selectively etched by dipping in dilute hydrofluoric acid and the third sidewall dielectric spacers 314a are removed by hot-phosphoric acid or anisotropic dry etching. A thermal oxidation is subsequently performed to form a first thermal poly-oxide layer 317a over the sidewalls of the first conductive layer 302c, a gate-oxide layer 316a over the semiconductor substrate 300, a second thermal poly-oxide layer 317b over the extended floating-gate layers 306c (as shown in FIG. 2D), and the intergate dielectric layers 303c are oxidized simultaneously to form a thicker intergate dielectric layer 303d. Note that the first/second thermal poly-oxide layers 317a, 317b can be further nitrided in a $N_2O$ ambient and are acted as a tunneling-dielectric layer and their thicknesses are between about 100 Angstroms and 300 Angstroms; a gate-oxide layer 316a is also nitrided and is acted as a gate-dielectric layer for the select gate and its thickness is between about 100 Angstroms and 300 Angstroms.

FIG. 4J shows that the planarized fourth conductive layers 318a are formed over the structure shown in FIG. 4I. The planarized fourth conductive layer 318a is formed by first depositing a thick fourth conductive layer 318 and then planarizing the deposited thick fourth conductive layer 318 using CMP and/or etching back. The planarized fourth conductive layer 318a is preferably made of doped polycrystalline-silicon or metal materials. The metal can be made of tungsten-silicides or tungsten being formed over a barrier-metal layer. In the following process steps, the planarized fourth conductive layer 318 uses the doped polycrystalline-silicon layer as an example.

FIG. 4K shows that the planarized fourth conductive layers 318a shown in FIG. 4J are etched back and the second metal-silicide layers 319a are formed over the etched-back planarized fourth conductive layers 318b. The second metal-silicide layer 319a can be obtained by a well-known silicidation process or by first depositing a planarized metal-silicide layer 319 and then etching back the planarized second metal-silicide layer 319. The second metal-silicide layer 319a is preferably made of a tungsten-silicide layer or other high melting-point silicide layer. It should be noted that if the etched-back fourth conductive layer 318b is made of metal materials, the second metal-silicide layer 319a can be deleted.

FIG. 4L shows that the fourth sidewall dielectric spacers 320a are formed over the sidewalls shown in FIG. 4K. The fourth sidewall dielectric spacer 320a is preferably made of silicon-nitrides or silicon-oxides as deposited by LPCVD. Note that the width of the fourth sidewall dielectric spacer 320a, which is used to determine the gate length of the control gate, can be controlled by the thickness of the deposited fourth dielectric layer 320.

FIG. 4M shows that the second metal-silicide layer 319a and the planarized fourth conductive layer 318b are selectively removed in a self-aligned manner by anisotropic dry etching to form the control-gate regions, and the common-drain diffusion regions 321a of a second conductivity type are formed in a self-aligned manner by implanting a moderate dose of doping impurities across the gate-dielectric layer 316a into the semiconductor substrate 300.

FIG. 4N shows that the gate-oxide layers 316a are removed, and the raised field-oxide layers 305b are etched by anisotropic dry etching or dipping in dilute hydrofluoric acid to form a second flat bed between the fourth sidewall dielectric spacers 320a, and the fifth sidewall dielectric spacers 322a are formed over the sidewalls and on the second flat bed. The fifth sidewall dielectric spacers 322a are preferably made of silicon-oxides or silicon-nitrides as deposited by LPCVD.

FIG. 4O shows that the planarized fifth conductive layers 323a are formed over the gaps between the fifth sidewall dielectric spacers 322a and on the second flat beds formed alternately by the common-drain diffusion regions 321a and the etched raised field-oxide layers 305c. The planarized fifth conductive layer 323a is preferably a doped polycrystalline-silicon layer deposited by LPCVD. A high-dose implantation is performed by implanting doping impurities into the planarized fifth conductive layers 323a. The hevaily-doped planarized third and fifth conductive layers 311b and 323a are acted as the dopant diffusion sources to form very shallow heavily-doped source/drain diffusion regions 309b and 321b, as shown in FIG. 4P.

FIG. 4P shows that a self-aligned silicidation is performed to form a third metal-silicide layer 324a over the planarized fifth conductive layers 323a.

FIG. 4Q shows the first interconnect-metal layer 325 is formed over the structure and a hard masking layer including a third masking dielectric layer 326a and its two sixth sidewall dielectric spacers 327a is formed over the first interconnect-metal layer 325 to pattern and etch the first interconnect-metal layer 325, the third metal-silicide layer 324a, and the planarized fifth conductive layers 323a to form a bit line 325a being integrated with the planarized fifth conductive islands 323b being capped with the third metal-silicide layers 324b (as shown in FIG. 2C through FIG. 2E). The first interconnect-metal layer 325 is preferably made of an aluminum layer or a copper layer being formed on a barrier-metal layer such as titanium-nitrides (TiN) or tantalum-nitrides (TaN). The third metal-silicide layer 324a is preferably made of refractory-metal silicides such as $TiSi_2$, $TaSi_2$, $NiSi_2$, $COSi_2$, $MOSi_2$, $PtSi_2$ or $WSi_2$. The hard masking layer is preferably made of silicon-nitrides or silicon-oxides as deposited by LPCVD. The cross-sectional views as marked by B–B', C–C', and D–D' in FIG. 4Q are shown in FIG. 2C, FIG. 2D, and FIG. 2E. It should be noted that the sixth sidewall dielectric spacer 327a is mainly used to eliminate the misalignment between the planarized fifth conductive islands 323b and the active regions as shown in FIG. 2E. It is also clear that the gaps between the bit lines can be filled with the planarized oxide layers such as silicon-oxides or phosphosilicate glass (PSG). Moreover, a thermal-oxidation process can be performed before forming the planarized oxide layers.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claim is:

1. A self-aligned split-gate flash memory cell, comprising:
    a semiconductor substrate of a first conductivity type;
    a cell region having an active region and two shallow-trench-isolation regions formed on said semiconductor substrate and being divided into three regions: a common-source region, a gate region, and a common-drain region, wherein said gate region is located between said common-source region and said common-drain region with an elongated control-gate being defined by a sidewall dielectric spacer formed on top of said elongated control-gate;
    a self-aligned split-gate structure being formed in said gate region with said elongated control-gate being formed on top of and said self-aligned split-gate structure being divided into two subregions: a floating-gate region and a select-gate region, wherein said floating-gate region comprising an integrated floating-gate layer with a floating-gate transistor being formed on a thin tunneling-dielectric layer is located near said common-source region and said select-gate region comprising a select-gate transistor being formed on a gate-dielectric layer is located near said common-drain region;
    a common-source diffusion region of a second conductivity type being formed in said semiconductor substrate by implanting doping impurities in a self-aligned manner into said active region is said common-source region; and
    a common-drain diffusion region of a second conductivity type being formed in said semiconductor substrate by implanting doping impurities in a self-aligned manner into said active region is said common-drain region.

2. The self-aligned split-gate flash memory cell according to claim 1, wherein said integrated floating-gate layer being defined by another sidewall dielectric spacer formed over said sidewall of said common-source region and being etched to have a steep floating-gate structure comprises a major floating-gate layer being formed on said thin tunneling-dielectric layer and two extended floating-gate layers being separately formed on a portion of nearby raised field-oxide layers; said major floating-gate layer has an intergate dielectric layer being formed on its top and a first thermal poly-oxide layer being formed over its steep sidewall; and said extended floating-gate layer has a second thermal poly-oxide layer being formed on its top and its sidewalls.

3. The self-aligned split-gate flash memory cell according to claim 1, wherein said integrated floating-gate layer being defined by another sidewall dielectric spacer formed over said sidewall of said common-source region and being etched to have an one-side tapered floating-gate structure comprises a major floating-gate layer being formed on said thin tunneling-dielectric layer and two extended floating-gate layers being separately formed on a portion of nearby raised field-oxide layers; said major floating-gate layer has an intergate dielectric layer being formed on its top and a first thermal poly-oxide layer being formed over its one-side tapered sidewall; and said extended floating-gate layer has a second thermal poly-oxide layer being formed on its top and its sidewalls.

4. The self-aligned split-gate memory cell according to claim 1, wherein an implanted region being formed under said gate-dielectric layer comprises a shallow implant region of a first conductivity type for threshold-voltage adjustment of said select-gate transistor and a deep implant region of a first conductivity type for forming a punch-through stop.

5. The self-aligned split-gate memory cell according to claim 1, wherein said common-source diffusion region is formed by a shallow heavily-doped diffusion region being formed within a deeper lightly-doped diffusion region or a heavily-doped diffusion region.

6. The self-aligned split-gate flash memory cell according to claim 1, wherein said common-drain diffusion region is formed by a shallow heavily-doped diffusion region being formed within a deeper lightly-doped diffusion region or a heavily-doped diffusion region.

7. The self-aligned split-gate flash memory cell according to claim 1, wherein said common-source region comprises a first sidewall oxide spacer being formed over a sidewall of said gate region and on a portion of a first flat bed being formed by said common-source diffusion region and first etched raised field-oxide layers, a common-source conductive bus line being formed over said first flat bed outside of said first sidewall oxide spacer, and a planarized thick-oxide layer being formed over said common-source conductive bus line and said first sidewall oxide spacer.

8. The self-aligned split-gate flash memory cell according to claim 1, wherein said common-drain region comprises a second sidewall oxide spacer being formed over a sidewall of said gate region and on a portion of a second flat bed formed by said common-drain diffusion region and second etched raised field-oxide layers and a planarized common-drain conductive island being formed on said common-drain diffusion region and a portion of nearby said second etched raised field-oxide layers outside of said second sidewall oxide spacer.

9. The self-aligned split-gate flash memory cell according to claim 2, wherein said first and second thermal poly-oxide layers are preferably nitrided in a-NaO ambient and are acted as a tunneling dielectri floating-gate layer to said elongated control-gate and said intergate dielectric layer is preferably a thicker thermal poly-oxide layer or an oxide-nitride-oxide (ONO) stricture being nitrided in a N2O ambient.

10. The self-aligned split-gate flash memory cell according to claim 7, wherein said common-source conductive bus line and said common-drain conductive island are made of doped polycrystalline-silicon and are heavily implanted with a high-dose of dopant impurities to be acted as dopant diffusion sources for forming shallow heavily-doped source/drain diffusion region of a second conductivity type within said common-source/drain diffusion region, said common-source conductive bus line is capped with a first metal-silicide layer, and said common-drain conductive island is capped with a second metal-silicide layer.

11. A contactless NOR-type self-aligned split-gate flash memory array, comprising:

a semiconductor substrate of a first conductivity type;

a plurality of parallel shallow-trench-isolation (STI) regions and a plurality of active regions being formed alternately on said semiconductor substrate, wherein each of the plurality of parallel STI regions is filled with a raised field-oxide layer;

a plurality of virtual gate regions and a plurality of common-source bus-line regions being formed alternately over said semiconductor substrate and transversely to the plurality of parallel STI regions, wherein the plurality of virtual gate regions are patterned by a masking photoresist step and are therefore sealable;

a plurality of common-source diffusion regions of a second conductivity type being formed by implanting doping impurities in a selfaligned manner into said semiconductor substrate of the plurality of active regions along the plurality of common-source bus-line regions;

a first flat bed being formed in each of the plurality of common-source bus-line regions and being alternately formed by said common-source diffusion region and a first etched raised field-oxide layer, wherein a pair of first sidewall dielectric spacers are separately formed over each sidewall of nearby said virtual gate regions and on a portion of said first flat bed, and each of the plurality of common-source bus-line regions comprises from top to bottom a planarized thick-oxide layer being formed over said pair of first sidewall dielectric spacers and a common-source conductive bus line being formed over said first flat bed between said pair of first sidewall dielectric spacers;

a self-aligned split-gate region being formed in each side portion of said virtual gate region and a common-drain region being formed between said self-aligned split-gate regions, wherein said self-aligned split-gate region is defined by a third sidewall dielectric spacer being formed over said first sidewall dielectric spacer in said common-source bus-line region and is divided into two subregions: a floating-gate region and a select-gate region having an elongated control gate formed tinder said third sidewall dielectric spacer; said floating-gate region comprising a plurality of integrated floating-gate layers with a plurality of floating-gate transistors being separately formed on a plurality of thin tunneling-dielectric layers is located near said common-source bus-line region; and said select-gate region comprising a plurality of select-gate transistors being separately formed on a plurality of gate-dielectric layers is located near said commondrain region;

a second flat bed being formed in each of the plurality of common-drain regions and being alternately formed by said common-drain diffusion region and a second etched raised field-oxide layer, wherein a pair of second sidewall dielectric spacers are formed over each sidewall of nearby said self-aligned split-gate regions and on a portion of said second flat bed, and each of the plurality of common-drain region,s comprises a plurality of planarized common-drain conductive islands being formed over said second flat bed between said pair of second sidewall dielectric spacers with each of the plurality of common-drain conductive islands being formed on said common-drain diffusion region and on a portion of nearby said second etched raised field-oxide layers; and a plurality of bit lines being formed alternately above the plurality of active regions and transversely to the plurality of common-source conductive bus lines and being electrically connected to the plurality of planarized common-drain conductive islands along the plurality of active regions, wherein each of the plurality of bit lines is formed by a metal layer together with the plurality of planarized common-drain conductive islands being simultaneously patterned and etched by a hard masking layer.

12. The contactless NOR-type self-aligned split-gate flash memory array according to claim 11, wherein the plurality of integrated floating-gate layers being defined by a sidewall dielectric spacer formed over said first sidewall dielectric spacer in said common-source bus-line region are etched to have a steep floating-gate structure and each of the plurality of integrated floating-gate layers comprises a major floating-gate layer being formed on said thin tunneling-dielectric layer and two extended floating-gate layers being separately formed on a portion of nearby said raised field-oxide layers; said major floating-gate layer has an intergate dielectric layer being formed on its top and a first thermal poly-oxide layer being formed over its steep sidewall; and said extended floating-gate layer has a second thermal poly-oxide layer being formed on its top and its sidewalls.

13. The contactless NOR-type self-aligned split-gate flash memory array according to claim 11, wherein the plurality of integrated floating-gate layers being defined by a sidewall dielectric spacer formed over said first sidewall dielectric spacer in said common-source bus-line region are etched to have an one-side tapered floating-gate structure and each of the plurality of integrated floating-gate layers comprises a major floating-gate layer being formed on said thin tunneling-dielectric layer and two extended floating-gate layers being separately formed on a portion of nearby said raised field-oxide layers; said major floating-gate layer has an intergate dielectric layer being formed on its top and a first thermal poly-oxide layer being formed over its one-side tapered sidewall; and said extended floating-gate layer has a second thermal poly-oxide layer being formed on its top and its sidewalls.

14. The contactless NOR-type self-aligned split-gate flash memory array according to claim 11, wherein an implanted region being formed under said gate-dielectric layer comprises a shallow implant region of a first conductivity type for threshold-voltage adjustment of said select-gate transistor and a deep implant region of a first conductivity type for forming a punch-through step.

15. The contactless NOR-type self-aligned split-gate flash memory array according to claim 11, wherein said common-source conductive bus line is made of doped polycrystalline-silicon and said doped polycrystalline-silicon is further heavily implanted with a high-dose of dopant impurities to be acted as a dopant diffusion source for forming a shallow heavily-doped diffusion region of a second conductivity type within said common-source diffusion region, and said common-source conductive bus line is capped with a first metal-silicide layer such as a tungsten-silicide layer or a high melting-point silicide layer.

16. The contactless NOR-type self-aligned split-gate flash memory array according to claim 11, wherein said planarized common-drain conductive island is a planarized doped polycrystalline-silicon island and said planarized doped polycrystalline-silicon island is further heavily implanted with a high-dose of dopant impurities to be acted as a dopant diffusion source for forming a shallow heavily-doped diffusion region of a second conductivity type within said common-drain diffusion region, and said planarized common-drain conductive island is capped with a second metal-silicide layer.

17. The contactless NOR-type self-aligned flash memory array according to claim 11, wherein said first sidewall dielectric spacer and said second sidewall dielectric spacer are made of silicon-oxides and said third sidewall dielectric spacer is made of silicon-oxides or silicon-nitrides.

18. The contactless NOR-type self-aligned split-gate flash memory array according to claim 11, wherein said metal layer being acted as said bit line is an aluminum layer or a copper layer being formed over a barrier-metal layer such as a titanium-nitride (TiN) layer or a tantalumnitride (TaN) layer.

19. The contactless NOR-type self-aligned split-gate flash memory array according to claim 11, wherein said hard masking layer is made of silicon-nitrides or silicon-oxides and comprises a masking dielectric layer being formed above said active region and its two sidewall dielectric spacers.

20. The contactless NOR-type self-aligned split-gate flash memory array according to claim 13, wherein said first/second thermal poly-oxide layers are nitrided in a NzO ambient and are acted as a tunnelingdielectric layer for erasing stored electrons in said integrated floating layer to said elongated control-gate and said intergate dielectric layer is made of a thicker thermal poly-oxide layer or an oxide-nitrideoxide ONO structure being nitrided in a N2O ambient.

* * * * *